US007282799B2

(12) United States Patent
Brunschwiler et al.

(10) Patent No.: US 7,282,799 B2
(45) Date of Patent: Oct. 16, 2007

(54) THERMAL INTERFACE WITH A PATTERNED STRUCTURE

(75) Inventors: Thomas J. Brunschwiler, Thalwil (CH); Urs Kloter, Dietikon (CH); Ryan Joesph Linderman, Zurich (CH); Bruno Michel, Adliswil (CH); Hugo E. Rothuizen, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/437,084

(22) Filed: May 19, 2006

(65) Prior Publication Data

US 2006/0286712 A1 Dec. 21, 2006

(30) Foreign Application Priority Data

May 20, 2005 (EP) .................................. 05010919

(51) Int. Cl.
*H01L 23/10* (2006.01)
*H01L 21/00* (2006.01)
*F28D 17/04* (2006.01)

(52) U.S. Cl. .................. 257/718; 257/719; 257/E23.1; 165/104.15; 438/106; 438/122

(58) Field of Classification Search ................ 257/718, 257/719; 438/106, 122; 165/104.15
See application file for complete search history.

(56) References Cited

U.S. PATENT DOCUMENTS

| 5,345,107 | A | 9/1994 | Daikoku et al. |
| 2005/0016714 | A1* | 1/2005 | Chung .................. 165/104.15 |
| 2005/0061474 | A1 | 3/2005 | Gelorme et al. |
| 2006/0246276 | A1* | 11/2006 | Chung ........................ 428/323 |

OTHER PUBLICATIONS

Thermal Resistance of Particle Laden Polymeric Thermal Interface Materials by R. Prasher, et al, In ASME Journal of Heat Transfer, vol. 125, Dec. 2003.

* cited by examiner

*Primary Examiner*—Evan Pert
(74) *Attorney, Agent, or Firm*—E. Dwayne Nelson; Anne Vachon Dougherty

(57) ABSTRACT

An interface is formed by pressing a patterned first surface and a second surface together, with a particle-loaded interface material in between. The first surface is fabricated with a pattern of channels designed to redistribute the velocity gradients that occur in the interface material during interface formation in order to control the arrangement, orientation and concentration of particles at the end of the interface formation. The concept finds application in thermal interfaces and controlled placement of nano and micro particles and biological molecules.

16 Claims, 9 Drawing Sheets

THERMAL INTERFACE WITH A PATTERNED STRUCTURE

FIELD OF THE INVENTION

This invention relates to an interface with a patterned structure and particularly relates to thermal interfaces between microprocessor chips and cooling devices.

BACKGROUND OF THE INVENTION

In the field of microelectronic chip packages, the interface between the chip package and a cooling device is a dominant thermal resistance. Techniques to improve thermal conduction at this interface are important features in thermal management solutions, along with the traditional techniques of reducing the chip package internal and external thermal resistance. Thermal interfaces are typically formed by pressing a flat surface of the microprocessor chip and a flat surface of the cooling device together, with a thermal interface material (TIM) in between that is forced to flow into cavities or non-uniformities of the surfaces. A TIM is generally a particle-loaded viscous medium, which is also known in the art as a paste or grease or adhesive.

In U.S. Pat. No. 5,345,107, a cooling apparatus for an electronic device is disclosed that comprises a solid cooling body in close contact, through a TIM, with a heat transfer portion of an electronic device. The surface of the cooling device in contact with the electronic device has a number of grooves arranged to communicate with the outside of the heat transfer portion. A spring member is provided for elastically pressing the solid cooling body into close contact with the electronic device via the TIM in a third layer. The grooves are arranged in a perpendicular structure on the surface of the heat transfer portion and the capacity of the grooves is arranged to be larger than the volume of the TIM surrounding the grooves and between the two heat transfer surfaces. This construction allows the solid cooling body to be brought into close contact with the electronic device by means of the TIM.

U.S. Patent Publication number 2005/061474 discloses a thermal interface for chip cooling. A flexible, thermally conductive enclosure containing a TIM of thermally conductive liquid or paste-like metal(s) is described. The enclosure is adapted to be placed between the flat surfaces of a chip and a heat sink to enhance heat transfer from the chip to the heat sink. The thermal interface enclosure is held in place by mechanical pressure rather than by bonding, thereby facilitating inspection and repair of the microprocessor device.

Generally, a TIM comprises a viscous matrix and a load of suspended conductive particles, which particles can be on a micro or nano scale. It is widely assumed that use of a low viscosity matrix, and thus a TIM of low effective viscosity, is preferable because such a material has a higher squeeze flow velocity (i.e., it can be distributed between the nearly adjacent surfaces more quickly). See, for example, "Thermal Resistance of Particle Laden Polymeric Thermal Interface Materials" by R. Prasher, J. Shipley, S. Prstic, P. Koning, J. L. Wang, in ASME Journal of Heat Transfer, vol. 125, December 2003. Thus, while it is preferable, in theory, to have a relatively large load of conductive particles in the TIM in order to increase thermal conductivity, in practice, larger loads have been shown to lead to an increased number of particle interactions and increased effective viscosity.

Thus, it is known in the art to position the microprocessor chip and the cooling device close together with a low effective viscosity TIM between them as a preferred way to increase the thermal conductivity to ambient and to improve microprocessor cooling.

Several problems are associated with known thermal interfaces. First, it is found that there is an unexpected limit on the proximity of two surfaces when pressed together in a thermal interface. For example, this limit is evident in results of experimental data for a TIM having a relatively low matrix viscosity of 100 cSt. It can be seen that, when using a 100 cSt viscosity TIM in a thermal interface having two flat surfaces, interface gap thickness increases markedly when the load of particles in the TIM exceeds a certain threshold, here, approximately 55% by volume. The minimum achievable distance between the surfaces is typically more than ten times the diameter of the average TIM particles, which corresponds to a substantial decrease in thermal conductivity.

Second, use of a TIM of low effective viscosity, due to a relatively low load of particles, entails the following problem. Experimental data shows that when the load of particles falls below a certain threshold, the effective conductivity is relatively close to the low value of the matrix material. The drop of conductivity is due to the fact that below the threshold there is little interaction between particles and the heat must pass through the low conductivity matrix. Above the loading threshold, heat is conducted by a "percolation" mechanism whereby random arrangements of interacting particles create a preferred thermal path. The effective conductivity above the percolation threshold is, however, still limited to a relatively low value compared to the expected conductivity of the particles mixed with the matrix.

Third, non-uniform thermal properties are observed at known interfaces, which results in significant temperature gradients within the chip. In particular, relatively smaller areas of high thermal conductivity and relatively larger areas of reduced conductivity are observed. When there is a relatively large distance between the two regions compared to the thickness of the chip or cooling device, the temperature profile along the surface develops into similar regions of maximum and minimum temperatures. Maximum chip temperature is a parameter that determines thermal reliability of a chip and, therefore, temperature gradients are detrimental.

Fourth, when the chip package is thermally cycled, due to on-off cycles or varying processing loads, an interface warping between hot and cold positions is observed due to differences in thermal expansion coefficients between the components in the system. This warping not only causes an undesirable TIM pumping effect which increases with a low effective viscosity TIM, but is also detrimental to the long term reliability of the interface due to voiding.

It is an aim of the present invention to provide a thermal interface which mitigates the problems of the known art. It is a further aim to provide a technique for the controlled placement of particles on various scales.

SUMMARY OF THE INVENTION

According to a first aspect of the present invention there is provided an interface comprising a first surface and a second surface that are in contact with each other via an interface material, wherein the first surface and the second surface are pressed together, and the first surface has an arrangement of channels located, at least approximately, at local pressure maxima in the interface material.

Preferably, the first surface is substantially quadrangular, and thus the arrangement of the channels comprises substantially straight lines connecting diagonally opposite corners of the first surface because the local pressure maxima in such an interface are located along straight lines connecting diagonally opposite corners.

The arrangement of the channels preferably further comprises substantially straight lines bisecting interior angles of channel-channel junctions and channel-edge junctions, wherein said substantially straight lines terminate on intersecting another substantially straight line. Advantage is gained through the introduction of the channels along the basic velocity gradients which reduces the pressure variations in the interface material.

The arrangement of the channels preferably further comprises substantially straight lines bisecting interior angles of channel-channel junctions and channel-edge junctions of the second level channels, wherein said substantially straight lines terminate upon intersecting another substantially straight line.

Preferably, the first surface has an initial arrangement of channels which subdivide the first surface into a plurality of quadrangles, and further channels located at least approximately at local pressure maxima in the interface material. In the case of a thermal interface, such an arrangement more evenly distributes velocity gradients in the thermal interface material, resulting in more uniform and improved thermal and mechanical properties across the interface.

The dimensions of the channels determine where the local pressure maxima occur in the interface and also the arrangement of channels at the next level. Advantageously, positioning of the velocity gradients, and hence the particle load suspended in the interface material, is possible through modification of channel dimensions. Thus, the channels may have a non-uniform width/depth/cross-section.

The interface material may be a thermal interface material and may have a volumetric loading greater than the percolation threshold of the interface material in order to ensure that thermal conductivity is improved when compared with thermal conductivity using percolation heat transfer only.

According to a second aspect of the present invention there is provided a method for controlling particle placement in an interface, the method comprising providing a first surface with an arrangement of channels and a second surface and an interface material in between, with the particles suspended in the interface material and pressing together the first surface and the second surface, wherein the channels are located at least approximately at local pressure maxima in the interface material.

A further embodiment may include a controlling step for additionally controlling particle placement by altering conditions of pressure and/or temperature.

BRIEF DESCRIPTION OF THE DRAWINGS

Embodiments of the present invention will now be described, by way of example only, with reference to the accompanying drawings in which.

DETAILED DESCRIPTION OF THE INVENTION

When a thermal interface is formed by pressing a flat face of the microprocessor chip and a flat face of the cooling device together, with a thermal interface material (TIM) between, the TIM flows in directions dependent upon the shape of the chip. For example, for a circular microprocessor chip, the net TIM flow speed is zero at the center of the circular face and increases with the radius. For a rectangular or quadratic chip, the TIM flow similarly increases with the distance from the center and additionally flows outward from the center until the edges of the chip are reached. Further, velocity gradients in the TIM develop due to pressure variations which are primarily a function of the distance the TIM must flow to reach the perimeter of the chip.

Figure 1:
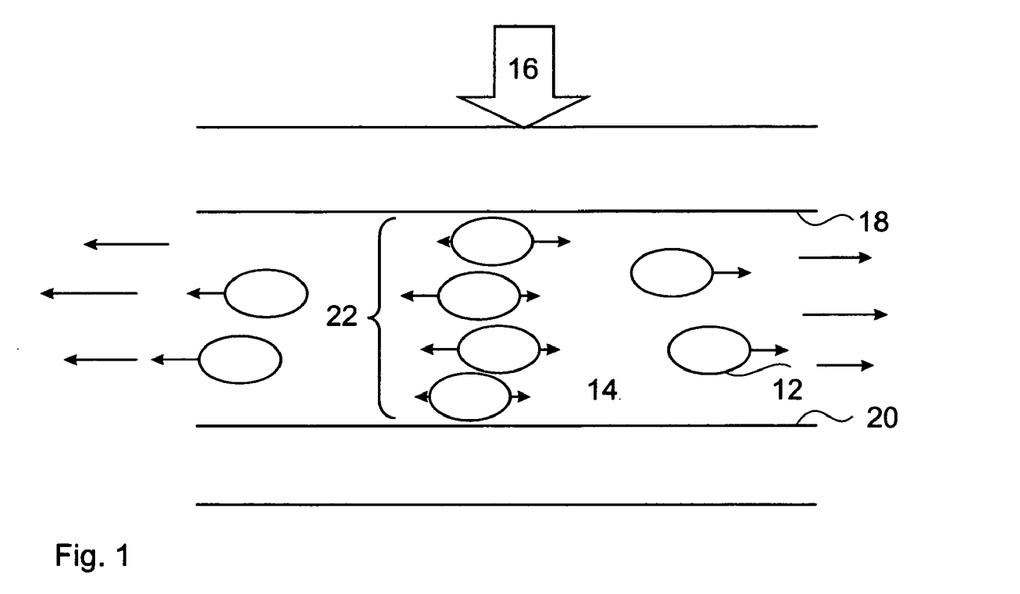
FIG. 1 depicts an enlarged schematic cross-sectional view of a thermal interface illustrating formation of a particle stacking line.

For a thermal interface on a quadrangular or rectangular plate, the velocity gradients are located along lines connecting diagonally opposite corners because the largest pressure drop occurs where the TIM must flow the largest distance to reach the perimeter of the chip from the center. FIG. 1 illustrates a cross-sectional view of a thermal interface 10 which shows particles 12 in the TIM, initially lying along the velocity gradient, are pulled equally in opposite directions due to a shearing force resulting from a force 16 pressing a chip face 18 and a cooling device face 20 together. Consequently, the particles 12 do not move outwards with the flow of the viscous matrix 14 of the TIM, but instead create a region of higher particle concentration or 'particle stack' 22.

Figure 2:
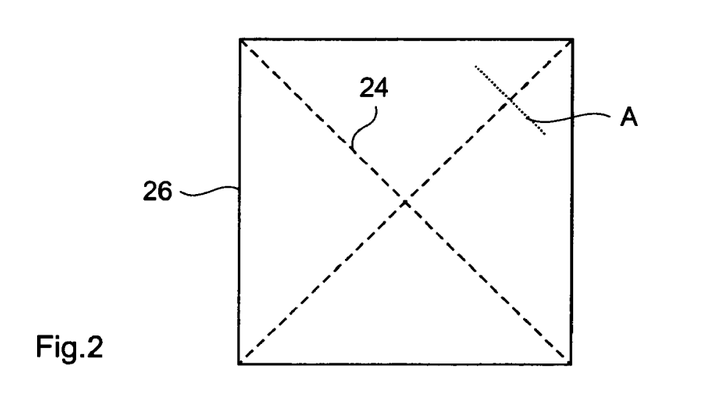
FIG. 2 shows a top view of particle stacking lines in the TIM on a rectangular cooling device as seen through an upper transparent plate.

FIG. 2 shows a top view of so-called 'particle stacking lines' 24 in the TIM on a rectangular plate 26 as observed through an upper transparent plate, when pressure is applied to force the two plates together. The particle stacking lines are located on straight lines between diagonally opposite corners of the plate. These particle stacking lines 24 along the velocity gradients are the root cause of the previously-described problems associated with known TIM-filled interfaces. Along particle stacking lines, higher thermal conductivity is evident in comparison to the thermal conductivity in the remaining regions. The dotted line A indicates where the cross-sectional view of FIG. 1 is taken.

The 'particle stacking' phenomenon has not previously been reported, understood or utilized. It is this phenomenon that is exploited in optimizing the thermal interface devices in accordance with the present invention.

Figure 3:
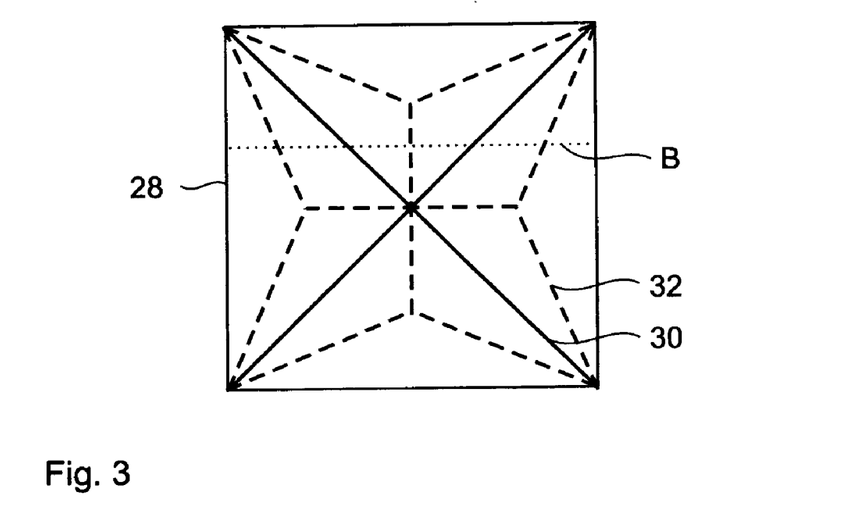
FIG. 3 shows a top view of corner-corner channels in a rectangular cooling device and associated particle stacking lines in the TIM.

FIG. 3 shows a top view of a rectangular cooling device 28, also referred to as a quadrangular plate 28. The surface of the cooling device 28, also referred to as first surface 28, has channels 30 fabricated therein. The channels 30 are depicted with a solid line and are located on straight lines between diagonally opposite corners of the first surface 28. The introduction of the channels along the basic velocity gradients 24 reduces the pressure variations in the TIM, also referred to as interface material 31, and has the effect of altering the pattern of the velocity gradients, and hence the pattern of particle stacking lines, also referred to as local pressure maxima. The resultant pattern of particle stacking lines comprises straight lines bisecting interior angles of channel-channel junctions, (i.e., where the paths of two channels meet) and channel-edge junctions (i.e., where a channel meets a peripheral edge of the cooling device). The particle stacking lines 32 form multiple triangular regions as are depicted with dashed lines in FIG. 3. The particle stacking lines 32 are more evenly distributed over the interface, thus resulting in more uniform thermal and mechanical properties and a reduced interface gap. The arrangement of the channels 30 is referred to as the first hierarchical level.

Figure 4:
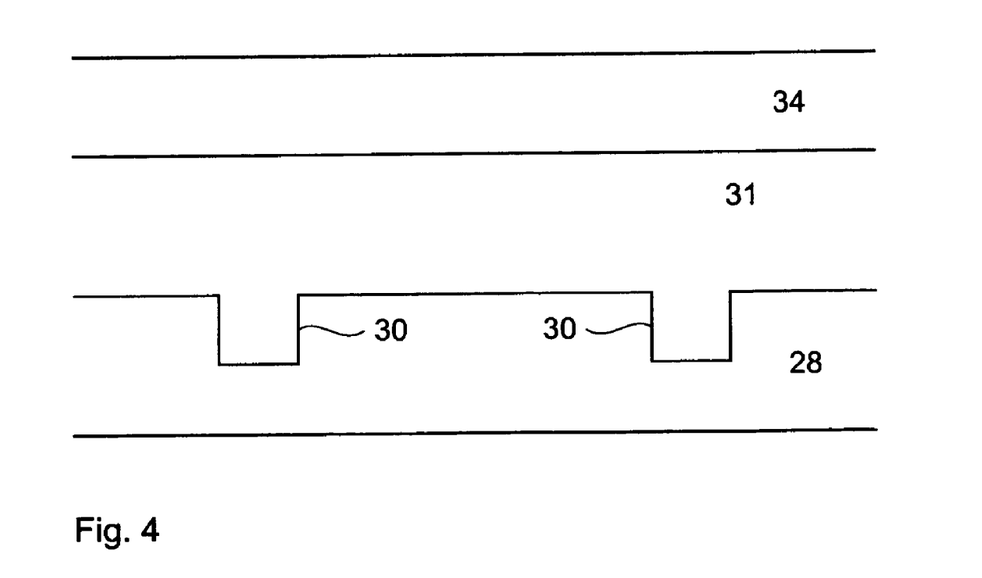
FIG. 4 depicts an enlarged schematic cross-sectional view along line B of FIG. 3.

FIG. 4 illustrates an enlarged cross-sectional view of the interface along dotted line B of FIG. 3. The two illustrated channels are rectangular in cross-section and are not shown to scale. In one embodiment of the interface between the microprocessor chip 34, also referred to as the second surface, and the cooling device 28, the channels 30 are approximately 220 microns wide and 250 microns deep. The TIM is indicated by reference numeral 31.

Figure 5:
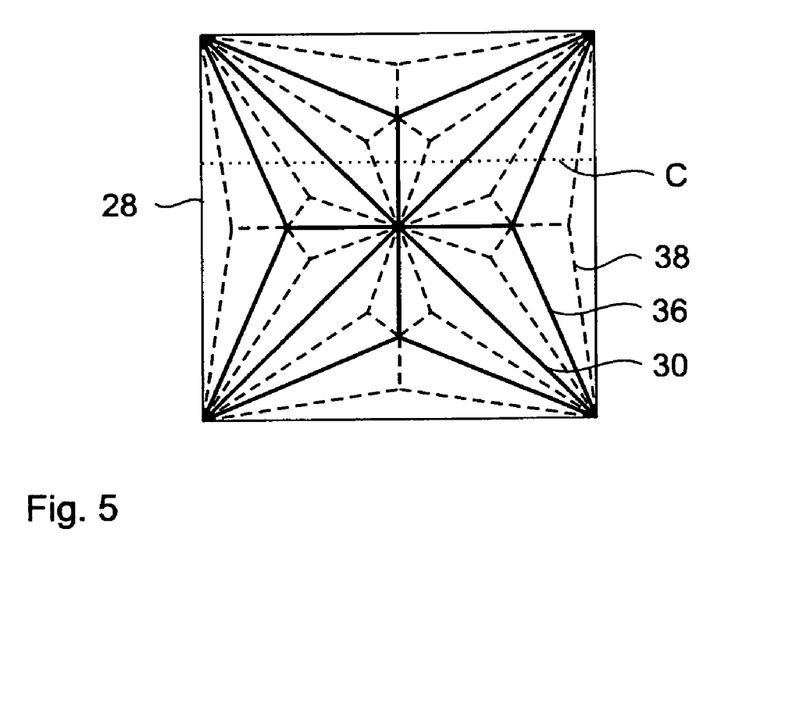
FIG. 5 shows a top view of 2-level nesting channels in a rectangular cooling device of the present invention and associated particle stacking lines in the TIM.

In order to increase the benefits evident in the embodiment illustrated in FIG. 3, FIG. 5 shows further channels 36 fabricated along the velocity gradients of the embodiment of FIG. 3. The arrangement of further channels 36 is referred to as the second hierarchical level. As a result of the additional hierarchical level of channels, the pressure variations in the TIM are further reduced and the pattern of the velocity gradients is altered, consequently altering the pattern of particle stacking lines. The resultant pattern of particle stacking lines comprises straight lines bisecting interior angles of channel-channel junctions and channel-edge junctions. The particle stacking lines 38 form multiple triangular regions, depicted with dashed lines in FIG. 5. The particle stacking lines 38 are yet more evenly distributed over the interface, resulting in more uniform thermal and mechanical properties, and a further reduced interface gap.

Figure 6:
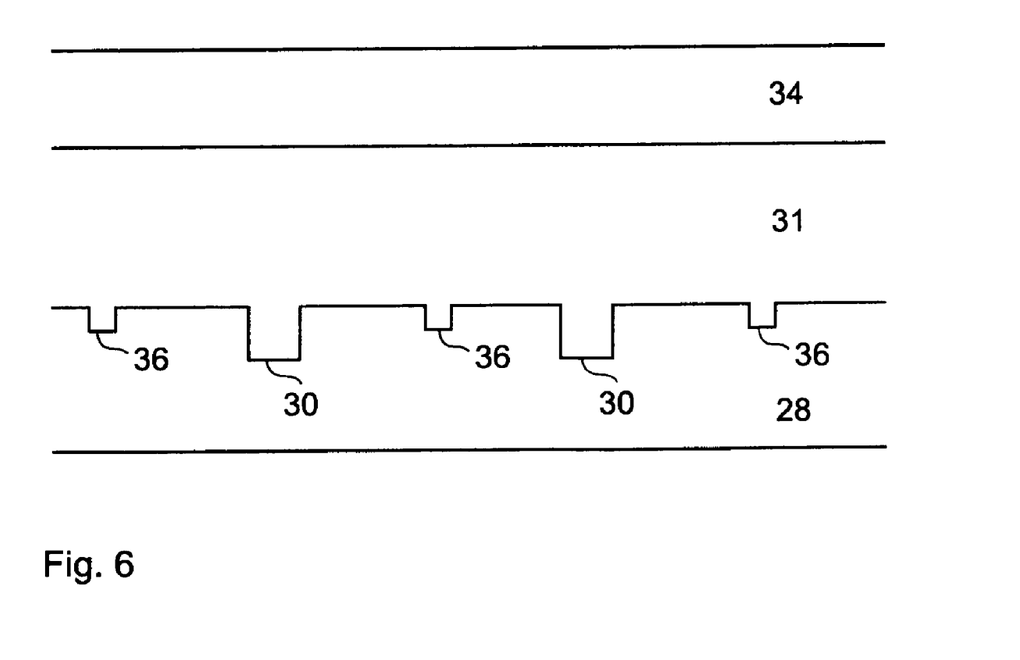
FIG. 6 depicts an enlarged schematic cross-sectional view along line C of FIG. 5.

FIG. 6 illustrates an enlarged cross-sectional view of the interface along dotted line C of FIG. 5. The five channels 36, 40 are shown as rectangular in cross-section and are not shown to scale. In one embodiment of the interface between the microprocessor chip 34 and the cooling device 28, the second level channels 36 are approximately 20 microns wide and 30 microns deep.

The hierarchy referred to is determined such that the first hierarchical level comprises channels along the local pressure maxima of the device without channels. The second hierarchical level comprises channels that are located along the local pressure maxima of the device with the channels of the first hierarchical level. This principle can be expanded to further levels (e.g., third, fourth, etc.).

In order to design preferred channel patterns, it is advantageous to predict a pattern of particle stacking lines. A 'stacking angle' is a parameter defined as the angle at which stacking originates from interior channel angles. In preferred embodiments of the present invention, each stacking angle is half of the associated interior channel angle. Where two adjacent channels cause identical pressure variation in the TIM, the resultant particle stacking line will bisect the interior angle of the two adjacent channels. Where two adjacent channels cause differing pressure variations in the TIM, the resultant particle stacking line will be formed closer to the channel causing the larger pressure variation.

The pressure variation caused by a channel is determined by the relative dimensions of the channel. Such pressure variations can be predicted by calculations based on Hagen-Poiseuille flow which defines the flow resistance in terms of viscosity of the medium (here, the TIM) and the channel dimensions. For a rectangular channel of length L, width w, and height h, the pressure drop $\Delta P$ of a fully developed liquid flow of viscosity $\mu$, is given by:

$$\Delta P = \mu \cdot \frac{L \cdot (w+h)^2}{w^3 \cdot h^3} \quad (1)$$

Viscosity is assumed to be uniform throughout the interface, and so can be factored out of Equation (1) arranged to match the pressure drop between two channels, A and B, as follows:

$$\frac{L_A \cdot (w_A + h_A)^2}{(w_A \cdot h_A)^3} = \frac{L_B \cdot (w_B + h_B)^2}{(w_B \cdot h_B)^3} \quad (2)$$

For rectangular substrates, the difference in length between channel A (connecting diagonally opposite corners of the substrate) and channel B (connecting the substrate center to the mid-point of a substrate edge) can be determined using right triangle geometry based on the angle $\theta$, between the channels:

$$L_A = \frac{L_B}{\cos(\theta)} \quad (3)$$

For a square substrate, with $\theta=45°$, the length of the channel connecting diagonally opposite corners, $L_A$, is exactly equal to $L_B\sqrt{2}$.

Fabrication of the channels in the surface of the cooling device can be realized using various techniques, such as etching, sawing, coining or stamping. Etching will result in the channels having a fixed depth, although the width can be varied. Sawing will result in the channels having a fixed width, although the depth can be varied. Other processes such as coining allow both width and depth to be varied. However, as specified in the equations above, the pressure variation ratio between the channels can be controlled by changing the width or the depth or both.

Figure 7:
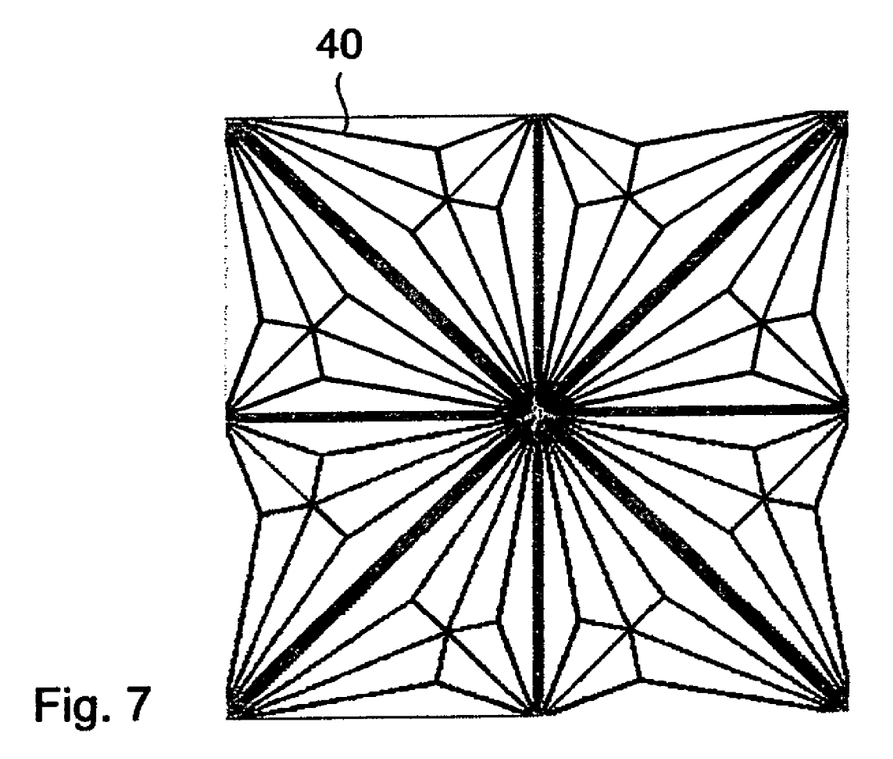
FIG. 7 shows a preferred embodiment of 3-level nesting channels in a rectangular cooling device.

FIG. 7 illustrates a preferred embodiment of the interface having third level channels 40, again located in accordance with the particle stacking concept. It can be appreciated that the principle of the positioning of the channels can be extended to fourth, fifth, etc. levels. The channels of this embodiment have varying dimensions in accordance with the stacking angle concept established above.

With reference to FIG. 7, it can be appreciated that interfaces having third and higher hierarchical level channels have a design that tends to produce a singularity at the center of the design, where a plurality of channels intersect, and channel spacing at the outer edges of the channel design which becomes increasingly wide. Therefore, for rectangular cooling devices having surface dimensions of approximately 15 mm×15 mm or more, a preferred embodiment utilizes a channel design having subdivided channel regions.

Figure 8:
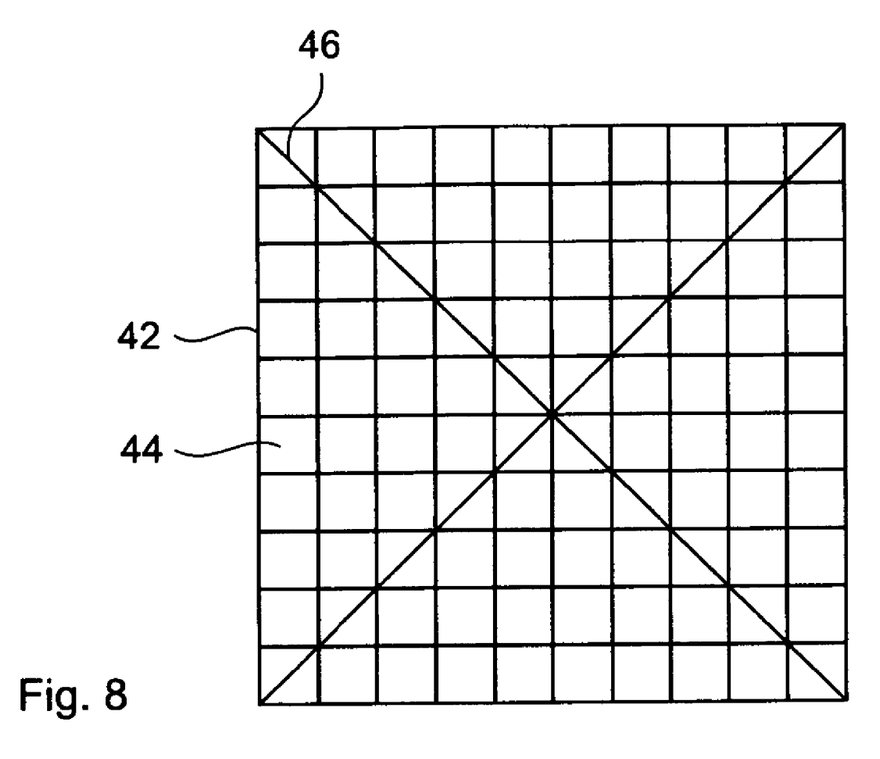
FIG. 8 shows a top view of an embodiment of a subdivided channel design in a cooling device.

FIG. 8 shows an embodiment of a subdivided channel design in a cooling device surface 42. The design has a plurality of subdivided rectangular regions 44 with channels 46 connecting diagonally opposite corners of the design as a whole. To improve thermal conductivity of such a design, channels can be fabricated along the velocity gradients, not shown, in the TIM of the embodiment of FIG. 8.

Figure 9:
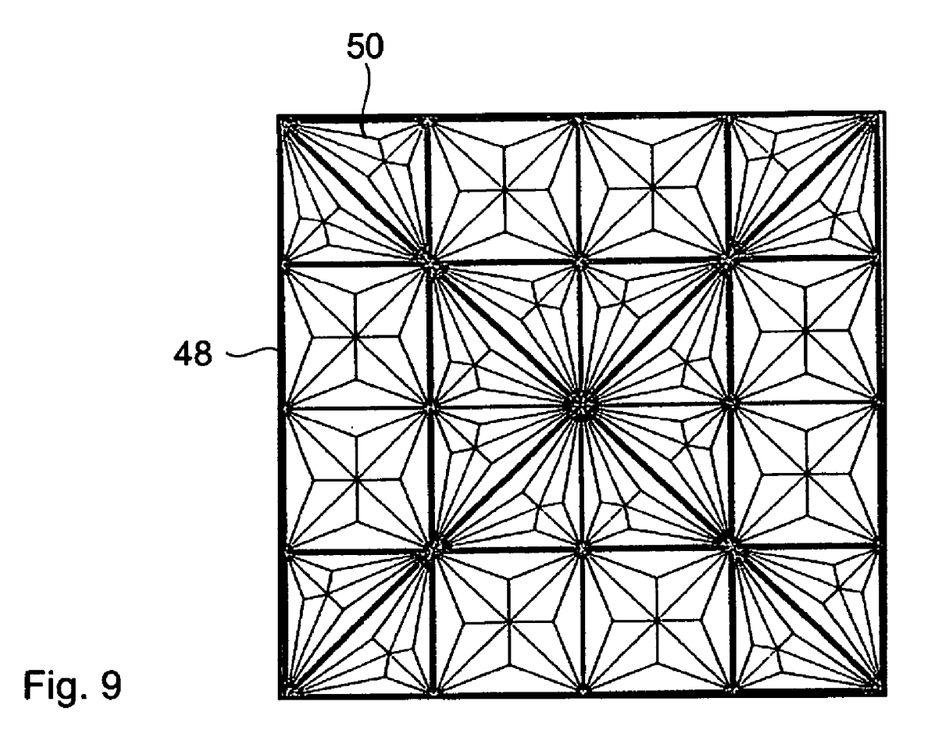
FIG. 9 shows a top view of an alternative embodiment of a subdivided channel design in a cooling device.

FIG. 9 illustrates an alternative embodiment of a subdivided channel design in a cooling device surface 48 having third hierarchical level channels 50, again located in accordance with the particle stacking and stacking angle concepts. Thus, the channel dimensions are modified dependent upon the required stacking angles. Consequently, the particle stacking lines, not shown, are more evenly distributed over the interface, resulting in more uniform and improved thermal and mechanical properties.

Figure 10:
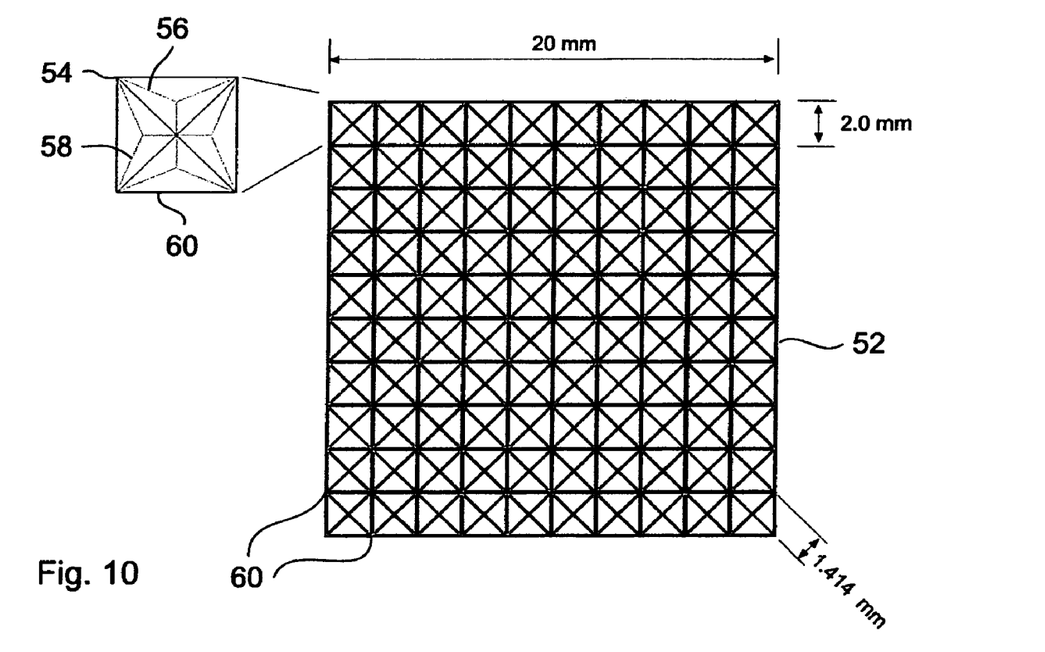
FIG. 10 shows a top view of a preferred embodiment of a subdivided channel design in a cooling device.

FIG. 10 shows an alternative embodiment of a subdivided channel design in a cooling device surface 52, in which each subdivided rectangular region 54 is bounded by channels 60 of the rectangular grid and channels 56 connect diagonally opposite corners. Further, each subdivided region comprises second level channels 58 in a design as described with respect to FIG. 5. The embodiment illustrated in FIG. 10 shows a total interface area of 20 mm×20 mm having rectangular subdivisions of 2 mm×2 mm. The channels 60 of the rectangular grid within the channel design of this embodiment have a width of 60 microns and a depth of 100 microns. The channels 56 connecting diagonally opposite corners of each subdivided region have a width of 60 microns and a depth of 120 microns. The second level channels 58 have a width of 20 microns and a depth of 30 microns.

It will be appreciated that the channel design of FIG. 10 can be scaled with relative ease to cover various sizes of interfaces.

Figure 11:
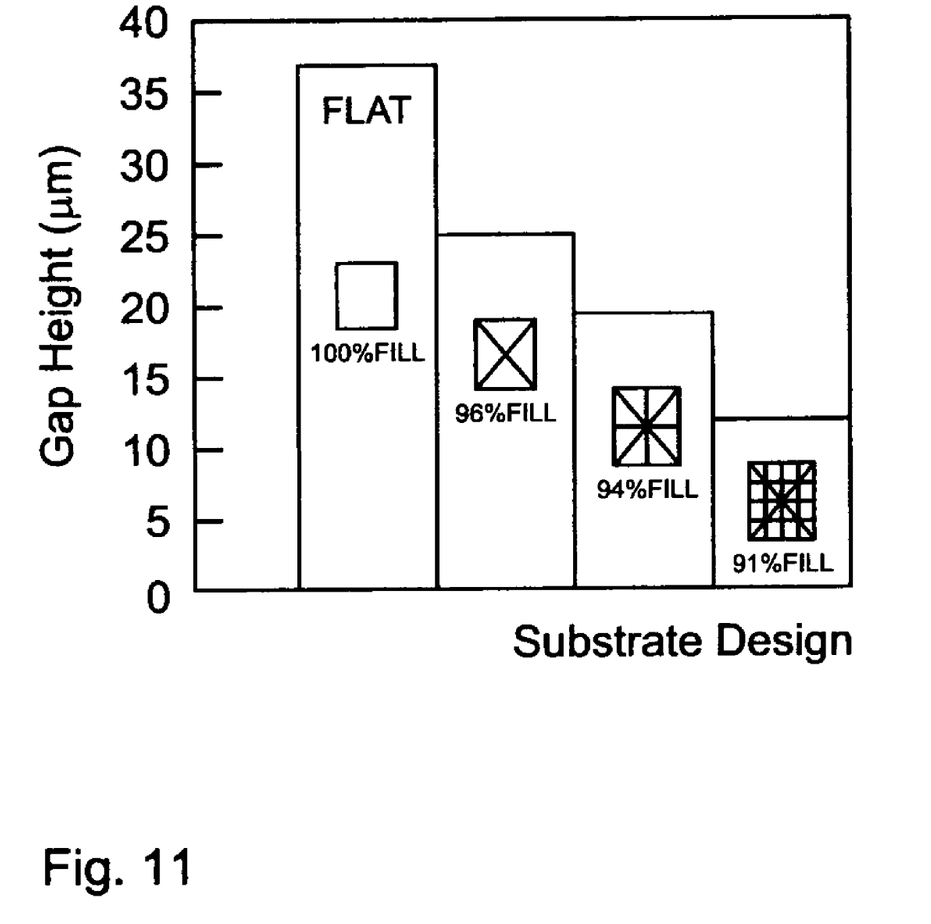
FIG. 11 is a chart showing experimental data for gap height for various channel designs.

FIG. 11 shows a graphical comparison of the effect of various channel designs on the interface gap. The interface gap is measured in microns. The TIM used with each interface design was a paste having a 57% volumetric loading of particles, wherein the particles were Ag particles having an average diameter of 2 microns and a maximum diameter up to 8 microns. The invention is not, however, intended to be limited to use only with the sample paste. The percentage fill data describes the relative area of the face of a cooling device at an interface that is flat compared to the area of the face comprising channels. For example, a cooling device having 94% fill, has 6% of the interface area comprising channels. It can be seen that a cooling device having 91% fill can achieve an interface gap of approximately 12 microns.

The composition of the TIM is a factor in the overall thermal conductivity of a thermal interface. While prior art interfaces favor use of a low viscosity matrix, and thus a TIM of low effective viscosity, it has been found that substantial advantage can be gained through use of a high viscosity matrix, and a consequent high effective viscosity TIM. Further, preferred embodiments of the thermal interface utilize a TIM having a relatively high volumetric load of conductive particles, for example, greater than 40%, in order to increase thermal conductivity.

Figure 12:
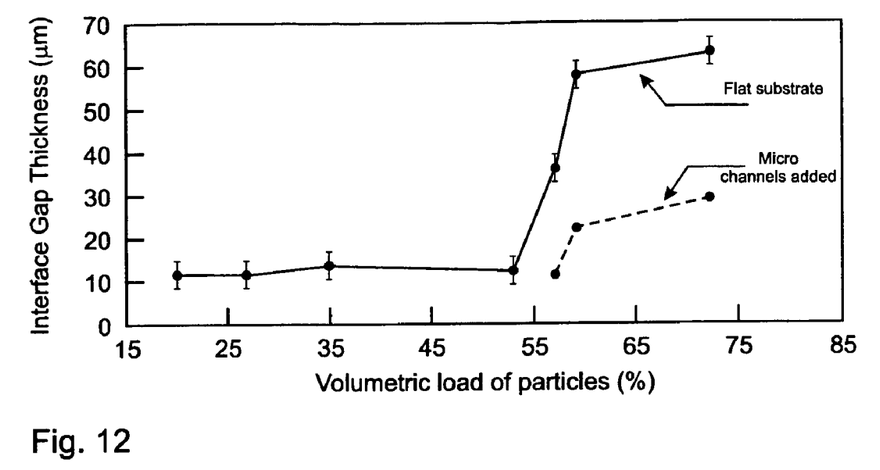
FIG. 12 is a graph showing data for a TIM having a matrix viscosity of 100 cSt used in a thermal interface having two flat surfaces, represented by a solid line, and used in a thermal interface having one surface comprising a channel design, represented by a dashed line.

FIG. 12 shows experimental data for a TIM having a composition of relatively low matrix viscosity of 100 cSt. It can be seen from FIG. 12 that, when using this TIM in a thermal interface having two flat surfaces represented by the solid line, interface gap thickness increases markedly when the load of particles in the TIM exceeds approximately 55% by volume. The load threshold above which interface gap thickness quickly increases with further loading is known as a 'stacking threshold', because the interface gap thickness increase can be shown to result from particle stacking. When using a thermal interface having one surface comprising a channel pattern designed to redistribute particle stacking, represented by a dashed line, the interface gap thickness is less than half of the value for flat surfaces when the load of particles in the TIM exceeds approximately 57% by volume.

Figure 13:
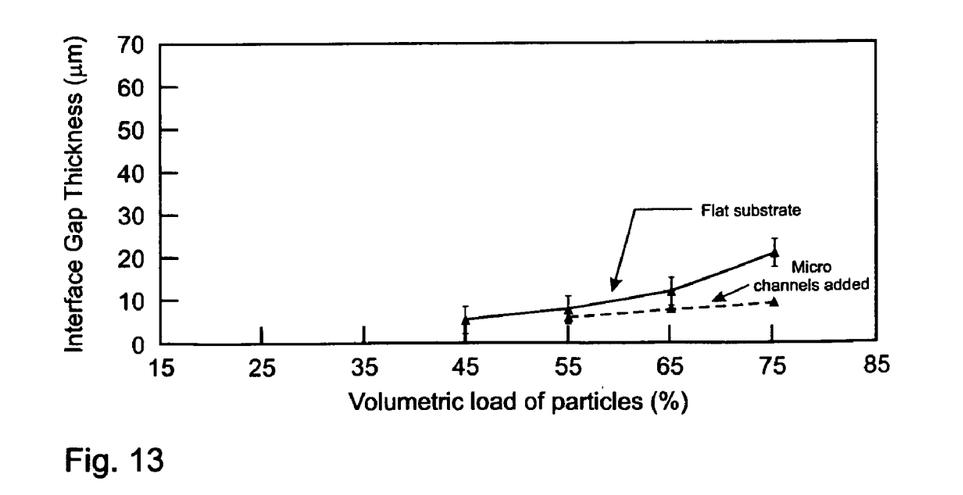
FIG. 13 is a graph showing data for a TIM having a matrix viscosity of 5000 cSt used in a thermal interface having two flat surfaces represented by a solid line, and used in a thermal interface having one surface comprising a channel design represented by a dashed line.

FIG. 13 shows experimental data for a TIM having a relatively high matrix viscosity of 5000 cSt. When using the higher viscosity TIM in a thermal interface having two flat surfaces (represented by the solid line), interface gap thickness increases from approximately 6 microns when the load of particles in the TIM is 45% by volume, to approximately 22 microns when the load of particles is approximately 75% by volume. Again, this interface gap thickness increase can be shown to result from particle stacking, although sensitivity to that phenomenon is lessened due to the reduced squeeze flow velocity and increased particle settling time associated with the higher viscosity. When using a thermal interface having one surface comprising a channel pattern designed to redistribute particle stacking, represented by a dashed line, the interface gap thickness is shown to be approximately constant at around 9 microns even when the volumetric load of particles in the TIM is relatively high.

Thus, a preferred embodiment of the present thermal interface comprises a cooling device surface fabricated with a preferred channel design, used in conjunction with a TIM having a relatively high viscosity matrix and a relatively high volumetric load of particles. It will be appreciated that the channel designs described provide improved thermal conductivity at a thermal interface by realizing a reduced interface gap width. It is shown that a packed layer of particles, a couple of particles deep, has better thermal conduction properties than more sparsely distributed particles in a viscous medium which rely on percolation heat transfer. In order to attain such a packed layer of TIM particles, the present thermal interface generates a distributed pattern of particle stacks over the entire interface surface, which equates as closely as possible to an even, densely packed layer of particles. In order to generate such a finely distributed pattern of particle stacks over the entire interface surface, an appropriate design of channels is provided in the surface of the cooling device. The relative dimensions of the channels control how particles stack throughout the interface during thermal interface formation.

The skilled person will be aware of alternatives to various aspects of the above described embodiments of a thermal interface. For example, it is also envisioned that the channel pattern can be fabricated on the surface of the microprocessor chip as an alternative to fabricating it on the surface of the cooling device. The surface of the microprocessor chip and cooling device can be variously shaped, such as a convex or concave or other non-flat form. Although, the channels of the embodiments described have rectangular cross-sections, clearly channels having other cross-sectional forms, for example, U-shaped or V-shaped are also viable. Whilst the embodiments described focus on the thermal interfaces of rectangular or rectangular microprocessor chips, the principle used to determine the channel designs can be more widely applied to other shapes, surfaces and interfaces.

The scope of this invention also includes the use of surface channels for the controlled deposition of micro and nano particles or biological molecules at a specific location and orientation on a substrate or chip. These particles or molecules are suspended in a fluid interface material which is located in an interface gap to which pressure is applied, in a similar fashion to the thermal interface material located in a thermal interface gap described above. The same channel design techniques described above can be scaled to the sub micron level and used to create an array of preferred particle contact locations as the fluid interface material is squeezed out from the interface gap. If it is desired to deposit a relatively small number of particles or a single particle along a stacking line, the particle volumetric loading of the fluid interface material can be decreased to an appropriate value that reduces the probability of a particle being deposited along the stacking line. The reduction in particle loading also allows for a corresponding reduction in matrix viscosity with the added benefit that the interface material squeezes to a nano scale gap in a shorter time period. If the suspended particles have a non-spherical shape, then the particles are deposited along the stacking line with an orientation perpendicular to the stacking line due to the flow of the fluid interface material away from the stacking line. In such a low viscosity scenario, an exemplary volumetric loading of particles can be less than 5%.

It will be appreciated that in any application of the present concept, the particle deposition can further be controlled through altering the conditions of the interface material. For example, through manipulation of the temperature or pressure applied, the rate of particle deposition can be influenced. In the case of increased temperature, increased matrix viscosity and increased Brownian motion of the suspended particles results, although it will be noted that the latter effect can be suppressed by increasing the viscosity of the interface material.

Improvements and modifications can be made to the foregoing without departing from the scope of the present invention.

The invention claimed is:

1. An interface comprising:
   a first surface;
   a second surface; and
   an interface material comprising particles in a medium, wherein said interface material is disposed between said first surface and said second surface when the first surface and second surface are pressed together and wherein the first surface has an arrangement of channels located in said first surface along at least regions of local pressure maxima of said interface material to redistribute velocity gradients along said channels and thereby control particles in said interface material.

2. The interface as claimed in claim 1, wherein the first surface is substantially quadrangular having four edges and four corners.

3. The interface as claimed in claim 2, wherein the arrangement of channels comprises substantially straight lines connecting diagonally opposite corners of the first surface.

4. The interface as claimed in claim 3, wherein the arrangement of channels further comprises substantially straight lines bisecting interior angles of channel-channel junctions and channel-edge junctions, wherein each substantially straight line terminates upon intersecting with another substantially straight line.

5. The interface as claimed in claim 4, wherein the arrangement of channels further comprises substantially straight lines bisecting interior angles of channel-channel junctions and channel-edge junctions, wherein each substantially straight line terminates upon intersecting with another substantially straight line.

6. The interface as claimed in claim 2, wherein the first surface has an arrangement of channels which subdivide the first surface into a plurality of quadrangles, and further channels comprising substantially straight lines connecting diagonally opposite corners of the first surface.

7. The interface as claimed in claim 1 wherein the channels have non-uniform dimensions.

8. The interface as claimed in claim 1 wherein the interface material is a thermal interface material.

9. The interface as claimed in claim 8, wherein the interface material has a volumetric loading greater than the percolation threshold of the interface material.

10. A method for controlling particle placement in an interface material at an interface between first and second surfaces, the method comprising the steps of:
    disposing particles in said interface material;
    providing an arrangement of channels in said first surface along at least regions of local pressure maxima of said interface material to redistribute velocity gradients along said channels and thereby control particles in said interface material; and
    pressing said interface material between said first surface and said second surface.

11. The method as claimed in claim 10, wherein the first surface is selected to be substantially quadrangular having four edges and four angles.

12. The method as claimed in claim 11, wherein said providing an arrangement of channels comprises arranging substantially straight channels connecting diagonally opposite corners of the first surface.

13. The method as claimed in claim 10 wherein the channels have non-uniform dimensions.

14. The method as claimed in claim 10 wherein the interface material is selected to comprise a thermal interface material.

15. The method as claimed in claim 10 wherein the interface material has a volumetric loading greater than the percolation threshold of the interface material.

16. The method as claimed in claim 10, further comprising a controlling step for additionally controlling particle placement by altering at least one of conditions of pressure and temperature.

* * * * *